US005533257A

United States Patent [19]
Romero et al.

[11] Patent Number: 5,533,257
[45] Date of Patent: Jul. 9, 1996

[54] METHOD FOR FORMING A HEAT DISSIPATION APPARATUS

[75] Inventors: Guillermo L. Romero; Joe L. Martinez, Jr., both of Phoenix, Ariz.

[73] Assignee: Motorola, Inc., Schaumburg, Ill.

[21] Appl. No.: 247,932

[22] Filed: May 24, 1994

[51] Int. Cl.⁶ .................................................. B23P 15/26
[52] U.S. Cl. ..................... 29/890.03; 164/98; 174/16.3; 165/80.3
[58] Field of Search .................... 29/890.03; 164/97, 164/98; 174/16.3; 165/80.2, 80.3, 80.4

[56] References Cited

U.S. PATENT DOCUMENTS

| | | | |
|---|---|---|---|
| 4,491,557 | 1/1985 | Breitmoser et al. | 29/890.03 |
| 4,777,998 | 10/1988 | Charbonnier | 164/259 |
| 4,879,891 | 11/1989 | Hinshaw | 29/890.03 |
| 4,920,864 | 5/1990 | Skingle et al. | 92/213 |
| 4,960,736 | 10/1990 | Luxzcz et al. | 264/60 |
| 5,007,475 | 4/1991 | Kennedy et al. | 164/97 |
| 5,014,776 | 5/1991 | Hess | 29/890.03 |
| 5,222,298 | 6/1993 | Schatz | 29/890.03 |
| 5,247,734 | 9/1993 | Lubbe et al. | 29/890.03 |
| 5,259,436 | 11/1993 | Yun et al. | 164/97 |
| 5,289,337 | 2/1994 | Aghazadeh et al. | 361/718 |
| 5,297,001 | 3/1994 | Sterling | 361/717 |
| 5,299,090 | 3/1994 | Brady et al. | 361/703 |
| 5,300,735 | 4/1994 | Yokono et al. | 174/264 |
| 5,321,888 | 6/1994 | Nemes | 29/890.03 |
| 5,428,897 | 7/1995 | Jordan et al. | 29/890.03 |

FOREIGN PATENT DOCUMENTS 6315731  11/1994  Japan ................ 29/890.03

*Primary Examiner*—Irene Cuda
*Attorney, Agent, or Firm*—Rennie William Dover

[57] ABSTRACT

A heat dissipation apparatus having a base structure (11) and fins (29, 43) and a method for making the heat dissipation apparatus. The base structure (11) is formed as a molded porous preform structure having a top surface (12), a bottom surface (13), and grooves (14) in the bottom surface (13). A layer of dielectric material (17) is placed on the top surface (12) and the porous base structure is infiltrated with a conductive material, thereby bonding the layer of dielectric material (17) to the base structure (11). The grooves (14) are coated with a conductive epoxy and the fins (29) are inserted into the grooves (14) to form a heat dissipation apparatus (30). Alternatively, the fins (43) are formed when the porous base structure is infiltrated with the conductive material, thereby forming a unitary heat dissipation apparatus (44).

16 Claims, 4 Drawing Sheets

5,533,257

METHOD FOR FORMING A HEAT DISSIPATION APPARATUS

The present application is related to co-pending U.S. patent application Ser. No. 07/972,347, Attorney's Docket No. SC08062T, entitled "METHOD FOR FORMING A POWER CIRCUIT PACKAGE," filed on Nov. 6, 1992, by Samuel J. Anderson et al. and assigned to the same assignee, Motorola, Inc.

The present application is further related to co-pending U.S. patent application Ser. No. 08/176,598, Attorney's Docket No. SC08507T, entitled "POWER DISSIPATION APPARATUS AND METHOD FOR MAKING", filed Jan. 3, 1994, by Guillermo L. Romero et al. and assigned to the same assignee, Motorola, Inc.

The present application is further related to co-pending U.S. patent application Ser. No. 08/190,974, Attorney's Docket No. SC08508T, entitled "ELECTRONIC DEVICE ASSEMBLY AND METHOD FOR MAKING", filed Feb. 3, 1994, by Guillermo L. Romero et al. and assigned to the same assignee, Motorola, Inc.

The present application is further related to co-pending U.S. patent application Ser. No. 08/130,824," entitled "SEMICONDUCTOR PACKAGE AND MODULE AND METHOD FOR FABRICATING", filed Oct. 4, 1993, by Guillermo L. Romero et al. and assigned to the same assignee, Motorola, Inc.

The present application is further related to co-pending U.S. patent application Ser. No. 08/235,292, Attorney's Docket No. SC08651T, entitled "ELECTRONIC MODULE FOR REMOVING HEAT FROM A SEMICONDUCTOR DIE AND METHOD OF MAKING", filed May 2, 1994, by Guillermo L. Romero et al. and assigned to the same assignee, Motorola, Inc.

FIELD OF THE INVENTION

The present invention relates, in general, to a heat dissipation apparatus, and more particularly, to a heat dissipation apparatus having a fin.

BACKGROUND OF THE INVENTION

An important design consideration for systems level designers in such areas as industrial power products, automotive power products, electric vehicles, power supplies, etc. is the removal of heat generated by the systems' electronic components. Generally, these components consume large amounts of power and generate large amounts of heat. Therefore, they are commonly referred to as power devices. If the heat generated by these devices is not removed, their junction temperatures will exceed a critical level, resulting in damage or destruction of the electronic components, the system, or both. A commonly used approach for removing heat from electronic components is to mount them to a metallic baseplate which in turn is mounted to a heat sink, wherein the heat sink transports heat away from the electronic components. A drawback of this type of assembly is the presence of a large thermal resistance at the interface between the baseplate and the heat sink.

Accordingly, it would be advantageous to have a heat dissipation apparatus for removing heat from semiconductor die that reduces or eliminates the thermal resistance at the interface between the baseplate and the heat sink.

DETAILED DESCRIPTION OF THE DRAWINGS

Generally, the present invention provides a heat dissipation apparatus for removing heat from integrated devices and a method for making or fabricating the heat dissipation apparatus. The heat dissipation apparatus has top and bottom surfaces and comprises a porous structure infiltrated or impregnated with a conductive material. The top and bottom surfaces are also referred to as major surfaces. Preferably, the top surface is planar and the bottom surface has at least one groove, wherein a layer of dielectric material is mounted to the top surface. In a first embodiment, a fin is coupled to the at least one groove via a thermally conductive epoxy. In a second embodiment, a fin extends from a portion of the bottom surface adjacent the groove, wherein the fin is molded from the conductive material. In a third embodiment, a fin extends from a portion of the bottom surface adjacent the groove, wherein the fin comprises a porous structure infiltrated with the conductive material.

Figure 1:
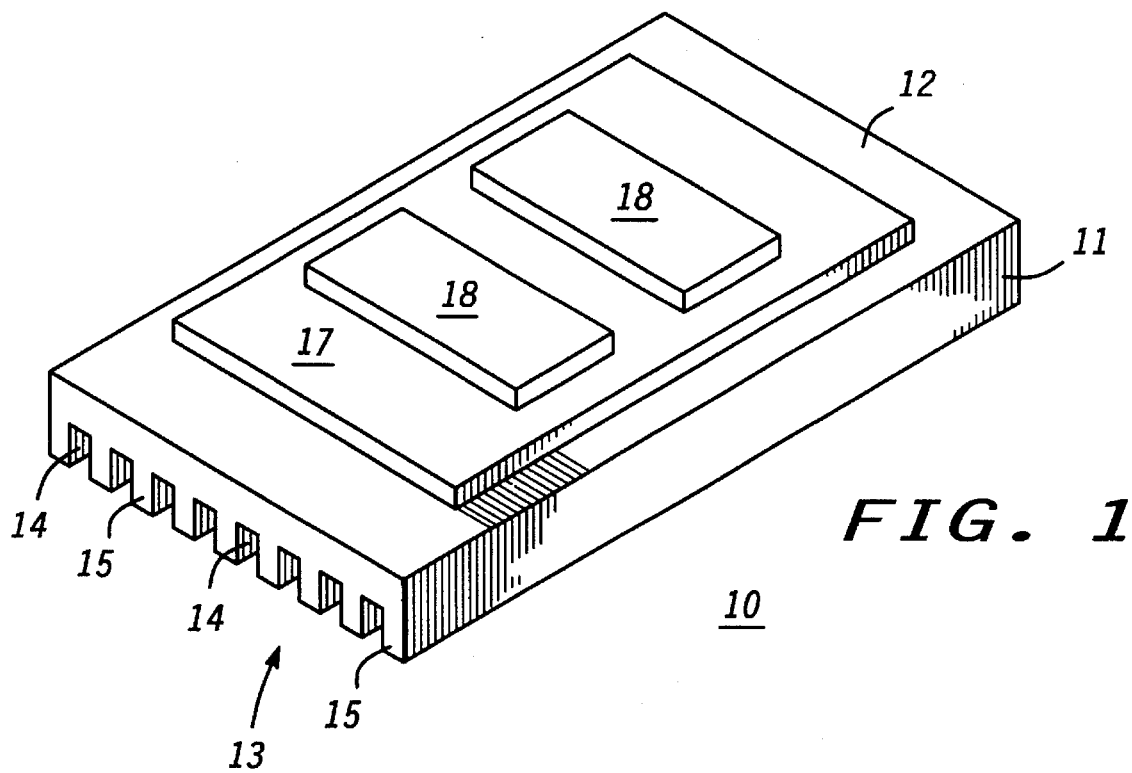
FIG. 1 illustrates an isometric view of a portion of a heat dissipation apparatus in accordance with a first embodiment of the present invention.
Figure 4:
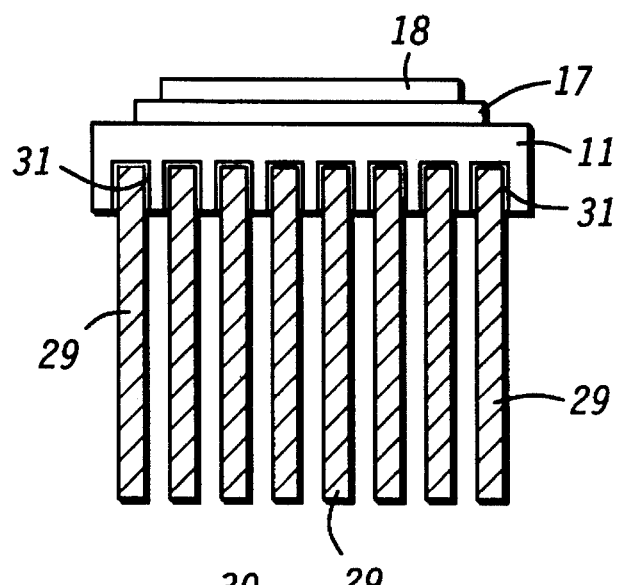
FIG. 4 illustrates a cross-sectional view of the heat dissipation apparatus in accordance with the first embodiment of the present invention.

FIG. 1 illustrates an isometric view of a portion 10 of a heat dissipation apparatus in accordance with a first embodiment of the present invention. The portion 10 of the heat dissipation apparatus comprises a base structure 11 having a top surface 12 and a bottom surface 13. Base structure 11 is also referred to as a baseplate. Bottom surface 13 has grooves 14 for mating with fins (not shown in FIG. 1). It should be noted however, that fins are shown in FIG. 4 and are referenced therein by reference number 29). In addition, grooves 14 provide support and serve as alignment aids for fins 29. It should be noted that the formation of grooves 14 results in the formation of protrusions 15 extending from base structure 11. Preferably, base structure 11 is formed as a porous preform from a slurry and molded into the desired shapes. The slurry comprises a mixture of a powdered semiconductor material such as, for example, silicon carbide and a binding agent such as a polymer based xylene.

Alternatively, base structure 11 may be formed by machining preform structures into the desired shapes. Subsequently, the binding agent is burned out of the preform structures, leaving a porous preform structure of silicon carbide. Methods of forming silicon carbide preform structures are described in U.S. Pat. No. 5,371,043 entitled "METHOD FOR FORMING A POWER CIRCUIT PACKAGE," issued to Samuel J. Anderson et al. On Dec. 6, 1994 and assigned to the same assignee, Motorola, Inc. U.S. Pat. No. 5,371,043 is hereby incorporated herein by reference.

FIG. 1 further shows a layer of dielectric material 17, i.e., an electrically insulating material, bonded to top surface 12. Suitable materials for layer of dielectric material 17 include ceramics such as, for example, aluminum oxide and aluminum nitride. In addition, layer of dielectric material 17 has conductive pads 18 mounted thereto. Dielectric material 17 and conductive pads 18 are further described with reference to FIGS. 3 and 4.

Figure 2:
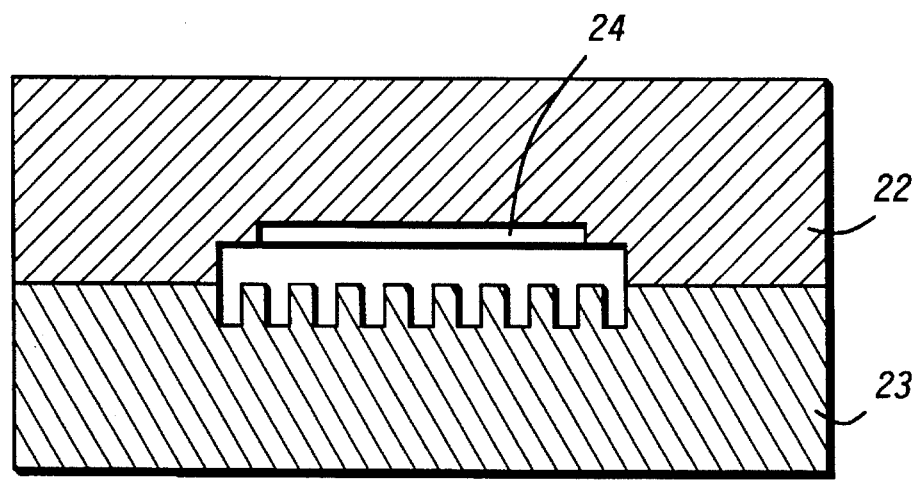
FIG. 2 illustrates a cross-sectional view of a portion of a mold assembly for forming the heat dissipation apparatus of FIG. 1.

Now referring to FIG. 2, a cross-sectional view of a portion 21 of a mold assembly is shown having a top portion 22 and a bottom portion 23. It should be understood that the same reference numerals are used in the figures to denote the same elements. Top portion 22 is mated with bottom portion 23 to form a mold cavity 24. In other words, top portion 22 cooperates with bottom portion 23 to form cavity 24. Methods for mating top and bottom portions of mold assemblies are well known to those skilled in the art.

Figure 3:
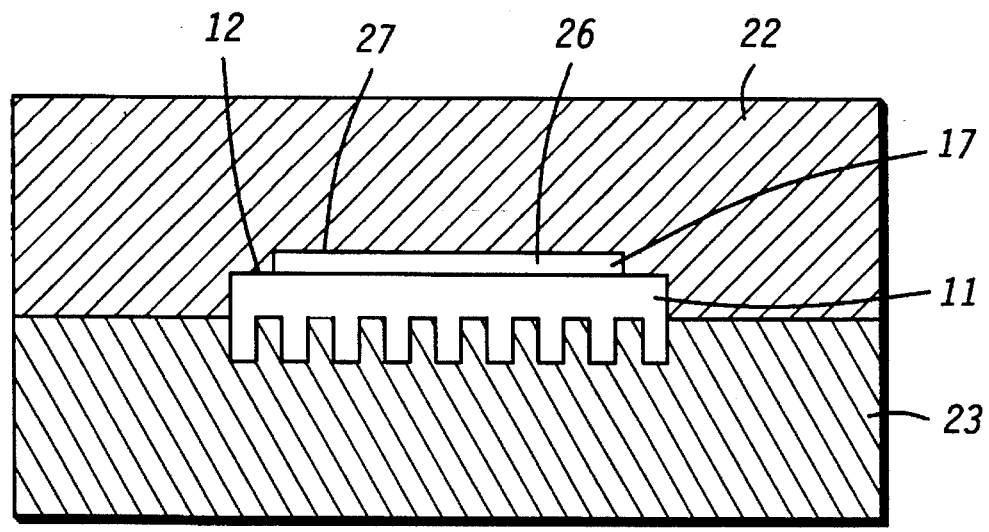
FIG. 3 illustrates a cross-sectional view of the mold assembly of FIG. 1 containing a porous base structure for formation of the heat dissipation apparatus in accordance with the first embodiment of the present invention.

Now referring to FIG. 3, base structure 11 is mated with bottom portion 23. Subsequently, layer of dielectric material 17 is placed on base structure 11. More particularly, a second major surface 26 of layer of dielectric material 17 contacts major surface 12 of base structure 11. Top portion 22 is secured to bottom portion 23 thereby forming mold cavity 24. In other words, base structure 11 and layer of dielectric material 17 are placed in mold cavity 24. Optionally, a portion of mold cavity 24 remains unfilled when top portion 22 is mounted to bottom portion 23. This unfilled portion of mold cavity 24 allows formation of a layer of conductive material on major surface 27 of layer of dielectric material 17.

A conductive material is injected, via runners (not shown), into mold cavity 24 (shown in FIG. 2). In one embodiment, the conductive material is molten aluminum which is injected at a pressure ranging between approximately 42 and 49 kilograms per square centimeter, i.e., between approximately 600 and 700 pounds per square inch. The molten aluminum infiltrates base structure 11 through continuous capillary flow. Although layer of dielectric material 17 remains impervious to the molten aluminum, injection of aluminum at pressures ranging between approximately 42 and 49 kilograms per square centimeter bonds the infiltrated base structure 11 to layer of dielectric material 17. Other suitable conductive materials include copper, alloys of copper, and alloys of aluminum. The infiltrated base structure 11 is removed from mold cavity 24.

Now referring to FIG. 4, aluminum fins 29 are coupled to infiltrated base structure 11 to form heat dissipation apparatus 30 in accordance with the first embodiment of the present invention. Layer of dielectric material 17 is bonded to infiltrated base structure 11. Conductive pads 18 are bonded to layer of dielectric material 17 and serve to couple semiconductor die (not shown) to heat dissipation apparatus 30. In other words, the semiconductor die are mounted to conductive pads 18. Techniques for bonding conductive pads 18 to dielectric materials such as layer of dielectric material 17 are well known to those skilled in the art. It should be noted that power leads (not shown) may also be bonded to conductive pads 18. Grooves 14 (shown in FIG. 1) are lined with a conductive epoxy 31 and aluminum fins 29 are inserted into the epoxy lined grooves 14, thereby increasing the surface area of base structure 11. Suitable conductive epoxies include silver filled or loaded epoxies.

Figure 5:
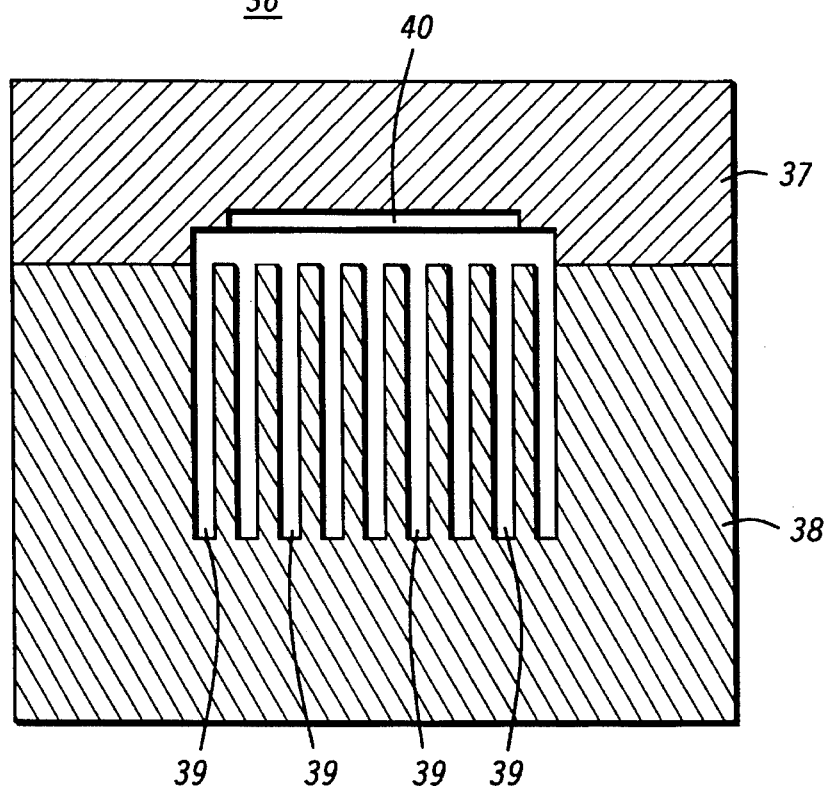
FIG. 5 illustrates a cross-sectional view of a portion of a mold assembly for forming a heat dissipation apparatus in accordance with second and third embodiments of the present invention.

FIG. 5 illustrates a cross-sectional view of a mold assembly 36 having a top portion 37 and a bottom portion 38, wherein bottom portion 38 has cavity extensions 39. Top portion 37 is mated with bottom portion 38 to form a mold cavity 40. In other words, top portion 37 cooperates with bottom portion 38 to form cavity 40.

Figure 6:
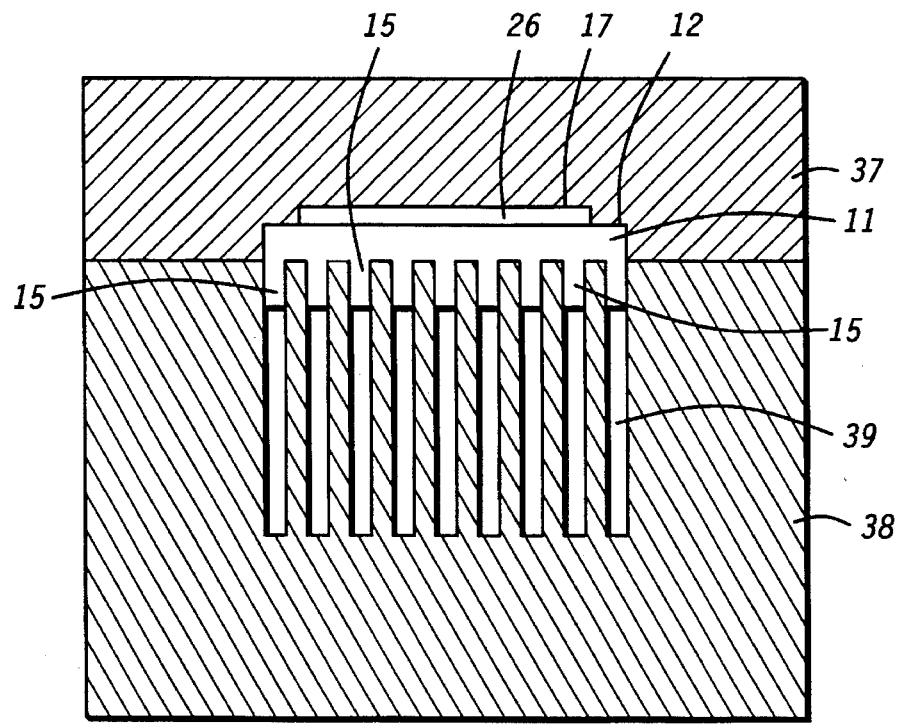
FIG. 6 illustrates a cross-sectional view of the mold assembly of FIG. 5 containing a porous base structure for formation of the heat dissipation apparatus in accordance with the second embodiment of the present invention.

Now referring to FIG. 6, base structure 11 is mated with bottom portion 38. Similar to bottom portion 23 of FIG. 1, bottom portion 38 is shaped to correspond to the shape of base structure 11. However, bottom portion 38 includes cavity extensions 39 which extend from protrusions 15 of base structure 11. Subsequently, layer of dielectric material 17 is placed on base structure 11. More particularly, a second major surface 26 of layer of dielectric material 17 contacts major surface 12 of base structure 11. Top portion 37 is secured to bottom portion 38, thereby forming mold cavity 40 (shown in FIG. 5). A conductive material is injected, via runners (not shown), into mold cavity 40. The molten aluminum infiltrates base structure 11 through continuous capillary flow. In addition, the molten aluminum fills cavity extensions 39, thereby forming fins. Thus, fins 43 and infiltrated base structure 11 form a unitary structure. Although layer of dielectric material 17 remains impervious to the molten aluminum, injection of aluminum at pressures ranging between approximately 42 and 49 kilograms per square centimeter bonds the infiltrated base structure 11 to layer of dielectric material 17. Other suitable conductive materials include copper, alloys of copper, and alloys of aluminum. The infiltrated base structure 11 is removed from mold cavity 40.

Figure 7:
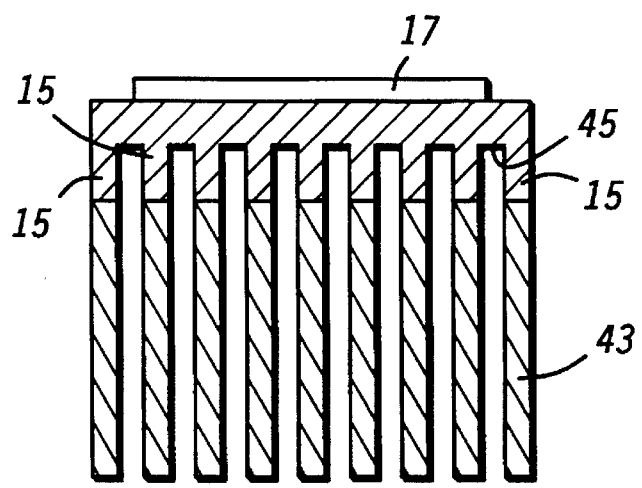
FIG. 7 illustrates a cross-sectional view of the heat dissipation apparatus in accordance with the second embodiment of the present invention.

FIG. 7 illustrates a front view of a unitary heat dissipation apparatus 44 in accordance with the second embodiment of the present invention. Unitary heat dissipation apparatus 44 comprises an aluminum infiltrated base structure 11 having fins 43 protruding from bottom surface 45. It should be understood that fins 43 serve to increase a surface area of heat dissipation apparatus 44. It should be further understood that heat dissipation apparatus 44 is a unitary structure. In other words, the interface between protrusions 15 and fins 43 is continuous, i.e., protrusions 15 and fins 43 are unitary structures.

Figure 8:
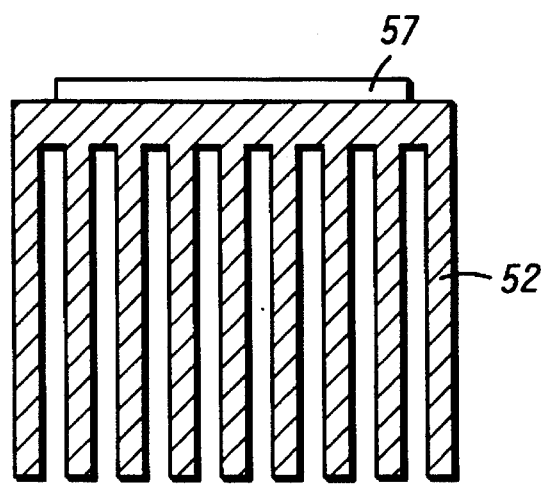
FIG. 8 illustrates a cross-sectional view of the heat dissipation apparatus in accordance with the third embodiment of the present invention.

FIG. 8 illustrates a front view of a unitary heat dissipation apparatus 51 having fins 52 in accordance with a third embodiment of the present invention. Unitary heat dissipation apparatus 51 is formed by placing a base structure (not shown) in mold assembly 36 (FIG. 5). Preferably, the base structure is a silicon carbide preform, wherein the shape of a bottom surface of the silicon carbide preform corresponds to the shape of bottom portion 38 of mold assembly 36. A layer of dielectric material 57 is placed on base structure 51. Subsequently, base structure 51 is infiltrated with a conductive material such as, for example, aluminum to form a unitary heat dissipation apparatus 51. It should be noted that infiltrating the silicon carbide preform with aluminum bonds layer of dielectric material 57 to the silicon carbide preform. Techniques for infiltrating the porous silicon carbide preform are well known to those skilled in the art. Optionally, conductive pads (not shown) may be formed on layer of dielectric material 57.

By now it should be appreciated that a heat dissipation apparatus and a method for forming the heat dissipation apparatus has been provided. Preferably, the heat dissipation apparatus includes a base structure having fins, wherein the fins increase the surface area of the heat dissipation apparatus which in turn increases the amount of heat dissipated. Since the heat dissipation apparatus is manufactured from a metal matrix composite of silicon carbide and aluminum, a layer of dielectric material may be integrally formed to the base structure, thereby decreasing a thermal resistance between the semiconductor die and the baseplate. Furthermore, since the fins are also integrally formed to the base structure, thermal resistance, i.e. contact resistance, between the baseplate and heat sink is reduced or eliminated. In other words, the heat dissipation apparatus is a unitary structure comprising a base structure, a dielectric layer, and heat fins. This unitary structure eliminates the need to mount the heat sink onto an external heat sink i.e. the heat sink is incorporated into the baseplate.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention. For example, the base structure may be a liquid cooled base structure or the base structure may be metal such as aluminum, copper, alloys of aluminum, alloys of copper, and the like.

We claim:

1. A method for forming a heat dissipation apparatus, comprising the steps of:

forming a porous base structure having a first major surface and a second major surface, wherein the first major surface has at least one groove;

infiltrating the porous base structure with a conductive material; and coupling at least one fin to the at least one groove of the first major surface.

2. A method for forming a heat dissipation apparatus as claimed in claim 1, wherein the second major surface of the porous base structure is planar.

3. A method for forming a heat dissipation apparatus as claimed in claim 1, wherein the step of infiltrating the porous base structure includes placing a first surface of a layer of dielectric material on a portion of the second major surface of the porous base structure, and wherein the conductive material bonds the porous base structure to the layer of dielectric material.

4. A method for forming a heat dissipation apparatus as claimed in claim 3, wherein the step of infiltrating the porous base structure further includes coating a second surface of the layer of dielectric material with the conductive material.

5. A method for forming a heat dissipation apparatus as claimed in claim 1, wherein the step of infiltrating the porous base structure with a conductive material includes using aluminum as the conductive material.

6. A method for forming a heat dissipation apparatus as claimed in claim 1, wherein the step of forming a porous base structure includes forming the porous base structure using a slurry comprising silicon carbide.

7. A method for forming a heat dissipation apparatus as claimed in claim 1, wherein the at least one groove of the first major surface of the porous base structure includes a plurality of grooves.

8. A method for forming a heat dissipation apparatus as claimed in claim 1, wherein the step of coupling at least one fin to the at least one groove includes coupling the at least one fin to the at least one groove with a thermally conductive epoxy.

9. A method for forming a heat dissipation apparatus, comprising the steps of:

providing a mold assembly having a first portion and a second portion, wherein the first portion has at least one cavity extension, and the first portion and the second portion cooperate to form a mold cavity;

providing a base structure having first and second major surfaces, at least one pore, and at least one groove in the first major surface;

placing the base structure in the first portion of the mold assembly;

placing an electrically insulating material on a portion of the second major surface of the base structure;

mating the first portion of the mold assembly with the second portion of the mold assembly, wherein the base structure occupies a portion of the mold cavity;

infiltrating the at least one pore of the base structure with a conductive material, wherein the conductive material bonds the electrically insulating material to the base structure; and removing the base structure that is infiltrated with the conductive material from the mold cavity.

10. A method for forming a heat dissipation apparatus as claimed in claim 9, wherein the step of placing the base structure in the first portion of the mold assembly includes mating the at least one cavity extension with the at least one groove.

11. A method for forming a heat dissipation apparatus as claimed in claim 10, wherein the step of infiltrating the base structure with a conductive material includes filling a portion of the at least one cavity extension with the conductive material.

12. A method for forming a heat dissipation apparatus as claimed in claim 9, wherein the step of placing an electrically insulating material on a portion of the second major surface of the base structure includes selecting the electrically insulating material from the group of aluminum nitride and aluminum oxide.

13. A method for forming a heat dissipation apparatus as claimed in claim 9, wherein the step of infiltrating the at least one pore of the base structure with a conductive material includes using aluminum as the conductive material.

14. A method for forming a heat dissipation apparatus as claimed in claim 9, wherein the base structure comprises silicon carbide.

15. A method for forming a heat dissipation apparatus as claimed in claim 9, wherein the step of infiltrating the base structure with a conductive material includes coating a portion of the electrically insulating material with the conductive material.

16. A method for forming a heat dissipation apparatus as claimed in claim 9, wherein the step of placing the base structure in the first portion of the mold assembly includes mating the at least one cavity extension with a portion of the base structure adjacent the at least one groove.

* * * * *